United States Patent [19]
Ko et al.

[11] Patent Number: 5,716,874
[45] Date of Patent: Feb. 10, 1998

[54] METHOD OF FABRICATING EPROM MEMORY BY INDIVIDUALLY FORMING GATE OXIDE AND COUPLING INSULATOR

[75] Inventors: Joe Ko; Gary Hong, both of Hsinchu; Chih-Hung Lin, Yilan, all of Taiwan

[73] Assignee: United Microelectronics Corporation, Taiwan

[21] Appl. No.: 603,248

[22] Filed: Feb. 20, 1996

[51] Int. Cl.⁶ ............................................. H01L 21/8247
[52] U.S. Cl. .................................... 438/261; 438/637
[58] Field of Search ........................... 437/43, 190, 191, 437/193; 148/DIG. 20

[56] References Cited

U.S. PATENT DOCUMENTS

| | | | |
|---|---|---|---|
| 4,924,437 | 5/1990 | Paterson et al. | 437/43 |
| 5,418,741 | 5/1995 | Gill | 437/43 |
| 5,460,991 | 10/1995 | Hong | 437/43 |
| 5,472,892 | 12/1995 | Gwen et al. | 437/43 |

*Primary Examiner*—Chandra Chaudhari
*Attorney, Agent, or Firm*—Rabin, Champagne, & Lynt, P.C.

[57] ABSTRACT

A method of fabricating an EPROM memory increases a coupling ratio and reduces lateral diffusion by forming a gate oxide layer and a coupling insulator individually. A substrate is provided with a field oxide layer to isolate a predetermined active area. A gate oxide layer is formed on the substrate. On the field oxide layer and the gate oxide layer, a polysilicon layer is deposited and defined, whereby a portion of this polysilicon layer and gate oxide layer form a gate electrode. Using the gate electrode as a mask, the substrate is implanted with impurities to provide source and drain electrodes. A dielectric layer is formed on polysilicon layer. A contact window (via) is formed in a predetermined area of dielectric layer. An insulator is deposited and defined by etching, on dielectric layer and the contact window. On the insulator and dielectric layer, a metal contact layer is deposited and defined to cover the insulator.

10 Claims, 5 Drawing Sheets

METHOD OF FABRICATING EPROM MEMORY BY INDIVIDUALLY FORMING GATE OXIDE AND COUPLING INSULATOR

BACKGROUND OF THE INVENTION

1. Field of the invention

The invention relates to a method of fabricating an EPROM (erasable programmable read only memory) and more particularly to such a method having a higher coupling ratio, but without affecting the quality of a gate oxide layer.

2. Background of the invention

EPROM (erasable programmable read only memory) is a memory circuit which has been popularly adapted in the computer and electronics industries. The merit of EPROM is that a saved program and data will not disappear under normal operating conditions but can be rewritten after irradiation with ultraviolet for a period of time.

EPROM is well known, but a review of its primary structure and some conventional operations will be helpful to an understanding of the invention.

1. Working principle

Referring to FIG. 1A, the traditional electronic circuit of an EPROM memory unit consists of a floating gate transistor 1 which includes one floating gate to store electrons, one control gate to control data access, and one source-drain NMOS transistor. The control gate is connected with a word line. A floating gate under the control gate is insulated therefrom in a floating state.

The silicon substrate and the source electrode of an EPROM memory unit are both connected to ground. Under extremely high positive voltage (this positive voltage is a reverse bias to the drain electrode), the junction of an N-type drain and the silicon substrate will experience the effect of carrier multiplication, because the drain lacks the protection of a lightly doped drain (LDD). A portion of the hot electrons, except those collected by the drain, will traverse the silicon dioxide layer between the floating gate and the silicon substrate, and be injected into the floating gate so that the floating gate is charged. Because of the potential barrier of silicon dioxide, the charge of the hot electrons cannot escape but is trapped inside the floating gate. Since the floating gate stores electrons at a net negative charge, when the EPROM memory unit is performing a data reading operation by raising the voltage of the control gate to 5V, an N-channel will not be formed and the result of reading should be "1". That is to say, if the floating gate of the EPROM memory unit is charged by hot electrons, then a signal "1" will be stored by the EPROM memory unit, whereas when hot electrons are not so held, a signal "0" will be stored.

2. Coupling ratio (CR)

The equivalent circuit of the electric capacitance in the EPROM memory unit of FIG. 1A, is shown by a schematic diagram in FIG. 1B, wherein the capacitance between the floating gate and the control gate is C1, the capacitance between the floating gate and the source electrode is C2, the capacitance between the floating gate and the NMOS channel (not shown) is C3, and the capacitance between the floating gate and the drain electrode is C4. The coupling ratio of the EPROM memory unit is defined as:

$$CR=C1/(C1+C2+C3+C4).$$

While the memory is being programmed, the higher is the value of the coupling ratio CR, the lower is the required voltage, and the efficiency of the component is increased. In the design of integrated circuits with higher packing density, it is very important to increase this component efficiency. From the above relationship, the value of CR can be raised if C1 is increased or C2, C3, C4 are reduced. Therefore, the coupling ratio can be increased by reducing the thickness of the insulator between the floating gate and the control gate.

3. Structure and deficiency of the conventional single polysilicon-single metal EPROM In FIG. 2A, the conventional structure of an EPROM is shown by a schematic diagram and FIG. 2B is a cross-sectional view taken along line I—I in FIG. 2A.

The EPROM memory unit is produced by using a conventional procedure to form a field oxide layer 11 on a silicon substrate 10 in order to isolate active areas and then to implant N-type impurities with high concentration into predetermined areas of the substrate 10 whereupon buried $N^+$ carrier areas, after etching, define a word line 18. A gate oxide layer 13 and a coupling oxide layer 15 are formed. On the gate oxide layer 13 and the coupling layer 15 a polysilicon layer 16 is then deposited. The polysilicon 13 layer 16 is etched to define a gate electrode. A source electrode 12 and a drain electrode 14 are formed by ion implantation in the silicon substrate, to construct a transistor 20. Finally a BPSG (borophosphosilicate glass) layer is deposited and vias (contact windows) are formed.

As shown in FIG. 2A, by raising the voltage of the word line 18, electrons traverse from the polysilicon layer 16 through the oxide layer 15 so that the polysilicon layer 16 is charged with a positive voltage and the silicon substrate is induced by the gate electrode to form a channel so that the transistor 20 becomes conductive. Thus, data can be stored.

There are two deficiencies in the above-described structure of a conventional EPROM:

1. Since the gate oxide layer 13 and the coupling oxide layer 15 are formed at the same time and the coupling oxide layer 15, which covers the buried $N^+$ carrier area 18, is thicker because of a faster speed of oxidization, the coupling ratio is apt to be low and consequently reduce the efficiency of programming.

2. There is lateral diffusion in the buried $N^+$ carrier area 18 and the source and drain 12/14 of transistor 20, so that if the size of the components is diminished, the active area will have a tendency to be punched through.

SUMMARY OF THE INVENTION

An object of the invention is to provide an effective method of manufacturing EPROM memory by defining the coupling area with a contact layer instead of forming the buried $N^+$ carrier area, so that the problem of lateral diffusion will not occur.

Another object of the invention is to provide a method of forming the floating gate oxide layer and the insulator individually whereby a higher coupling ratio will be obtained and the quality of the gate oxide layer will not be affected.

In accordance with the objects of this invention, a new method of fabricating an EPROM memory has been achieved. The method contains the following steps: A substrate is provided with a field oxide layer to isolate a predetermined active area. A gate oxide layer is formed on the substrate. A polysilicon layer is deposited on the field oxide layer and the gate oxide layer, a polysilicon layer is deposited. A portion of this polysilicon layer forms a gate electrode. Using this gate electrode as a mask, the substrate is implanted with impurities to provide source and drain electrodes. A dielectric layer then is formed. A contact window (via) is formed in a predetermined area of the dielectric layer. An insulator is deposited and defined by etching on the dielectric layer and the contact window. On the insulator and the dielectric layer, a metal contact layer is deposited and defined to cover the insulator, and thereby complete the procedure of fabricating a EPROM memory.

BRIEF DESCRIPTION OF THE DRAWINGS

These and other features and advantages on the invention will be more completed understood from the following detailed description of the preferred embodiment with reference to the accompanying drawings forming a material part of this description, in which.

DETAILED DESCRIPTION OF THE PREFERRED EMBODIMENT

Figure 1A:
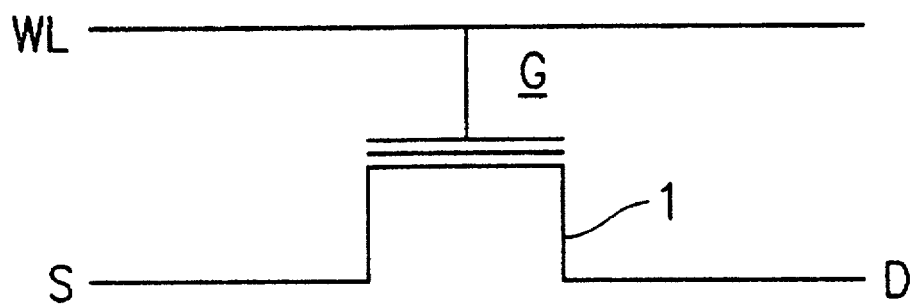
FIG. 1A is a schematic diagram of a conventional circuit of an EPROM memory unit.
Figure 1B:
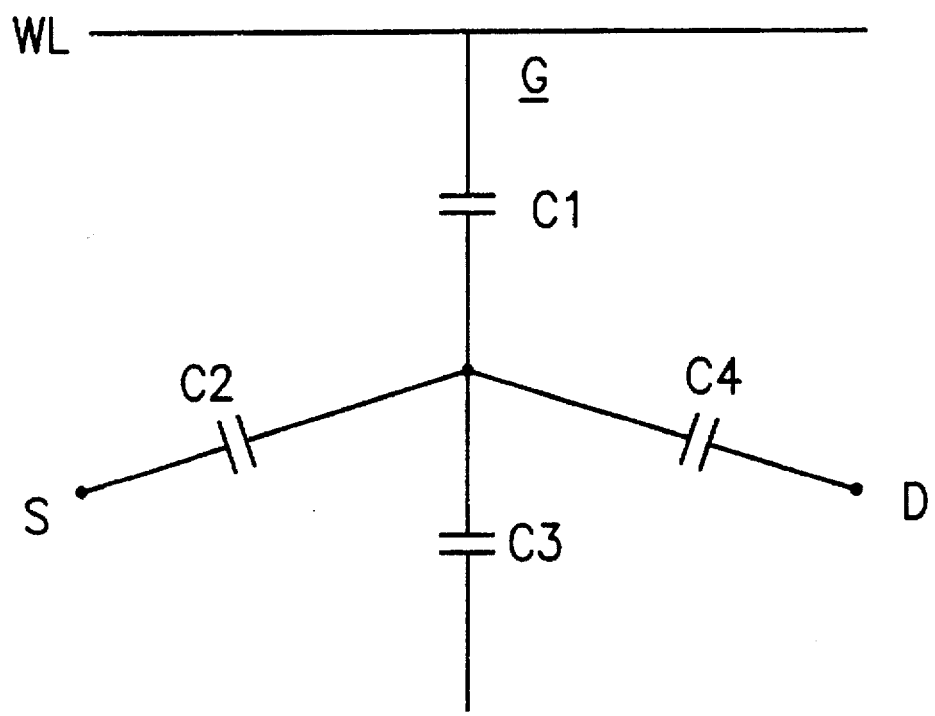
FIG. 1B is a schematic diagram of the equivalent circuit of the electric capacitance in the EPROM memory unit shown in FIG. 1A.
Figure 2A:
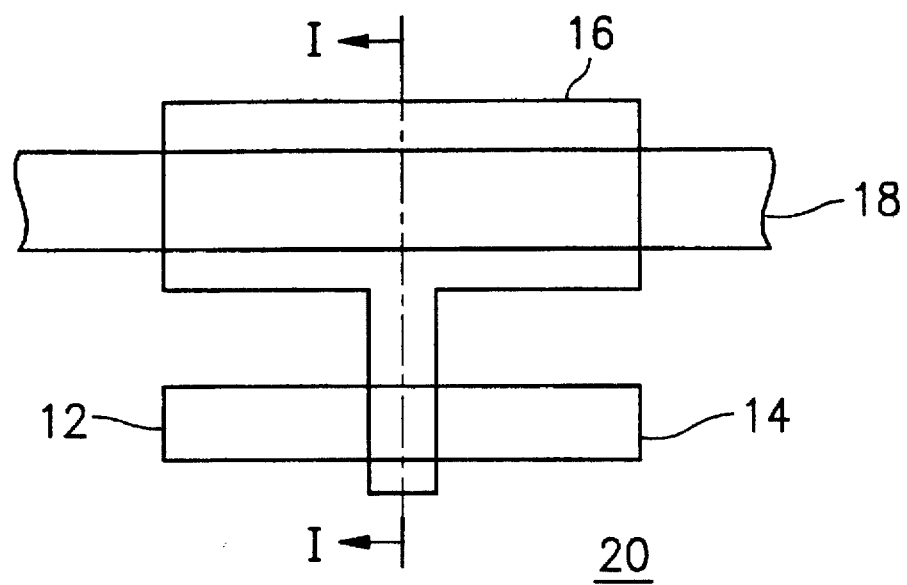
FIG. 2A is a schematic top view illustrating the conventional structure of an EPROM.
Figure 2B:
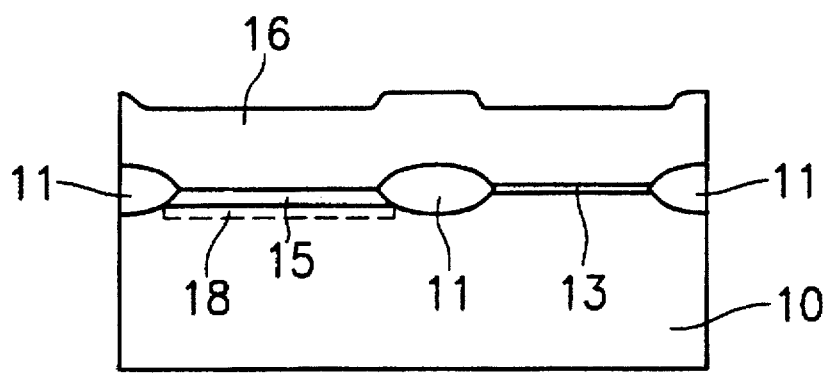
FIG. 2B is a cross-sectional view taken along line I—I in FIG. 2A.
Figure 3A:
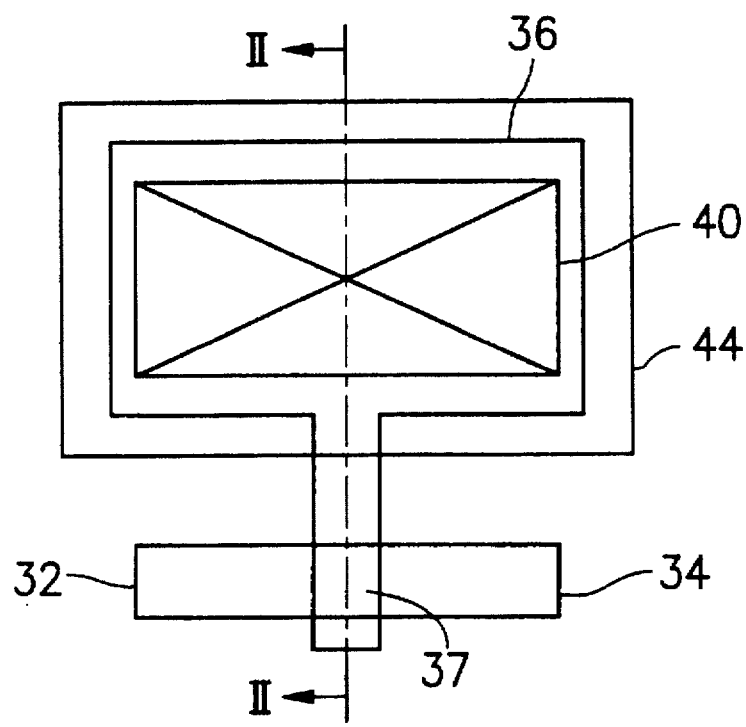
FIG. 3A is a schematic top view illustrating the structure of an EPROM according to the invention.

The procedure and method of manufacturing an EPROM memory according to the invention are described hereinafter with reference to FIGS. 3A through 3E, wherein FIG. 3A illustrates the EPROM structure of the invention and FIGS. 3B through 3E are cross-sectional diagrams at different stages of the manufacture of the EPROM structure shown in FIG. 3A, taken in the direction of line II—II in FIG. 3A.

Figure 3B:
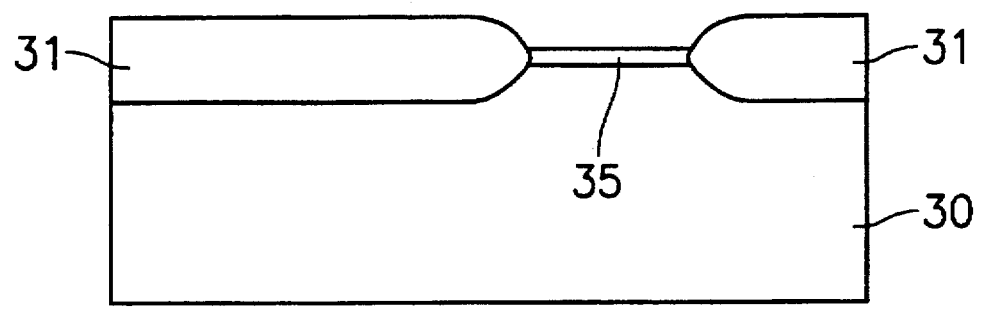
FIGS. 3B through 3E schematically illustrate one preferred embodiment of the method of the invention, in cross-sectional representation along line II—II in FIG. 3A.

Referring to FIG. 3B, on a silicon substrate 30, a field oxide layer 31 is formed by conventional oxidation to isolate active areas, and then a gate oxide layer 35 is formed. For example, on an N-type silicon substrate with a P-well, a field oxide layer 31 is formed by using the method of LOCOS (local oxidation of silicon) to isolate the active areas. Thereafter, a gate oxide layer 35 is formed by thermal oxidation or CVD (chemical vapor deposition).

Figure 3C:
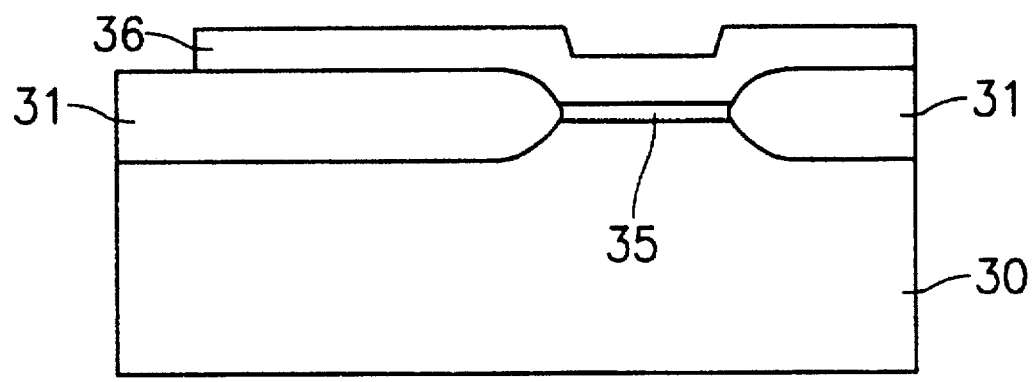

Referring to FIG. 3C, on the field oxide layer 31 and the gate oxide layer 35, a polysilicon layer 36 is deposited and defined, whereby a portion of this polysilicon layer forms a gate electrode 37 (shown in FIG. 3A). The silicon substrate is implanted with impurities to provide source and drain electrodes 32/34. For example, on the field oxide layer 31 and the gate oxide layer 35, the polysilicon layer 36 is deposited and implanted with impurities. Thereafter, a gate electrode 37 is formed and defined using a mask. Furthermore, by using this gate electrode 37 itself as a mask, the silicon substrate is implanted with impurities such as arsenic ions to provide the source and drain electrodes 32/34.

Figure 3D:
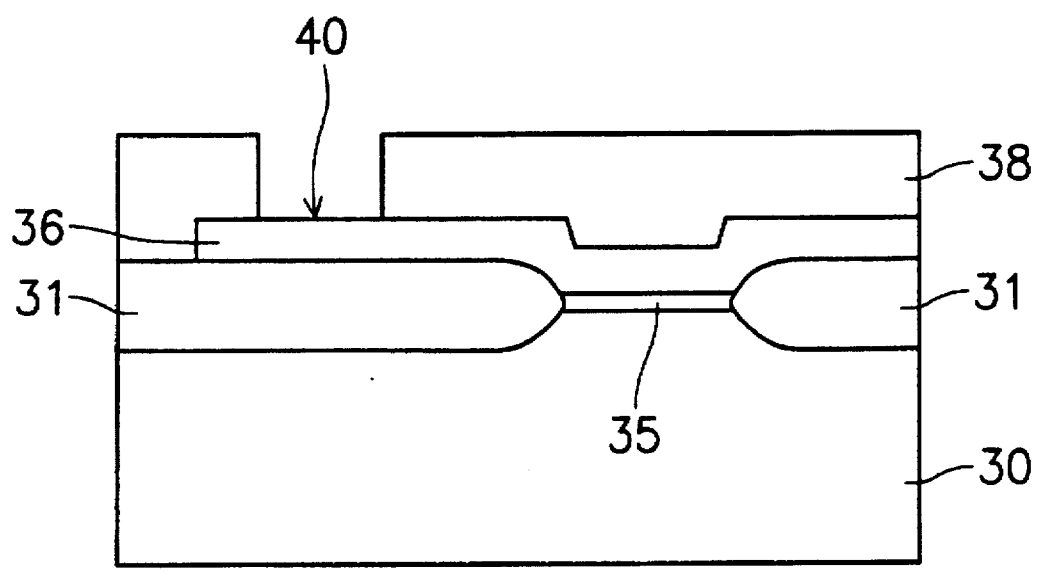

Referring to FIG. 3D, on the polysilicon layer 36 and a portion of the field oxide layer 31, a dielectric layer 38 is deposited and then a contact window is formed. For example, on the polysilicon layer 36 and the portion of field oxide layer 31, a layer of BPSG (boric phosphoric silicon glass) is deposited and planarized. By etching through a mask-defined predetermined area of the BPSG dielectric layer 38 to the polysilicon layer 36, a contact window (via) 40 is formed.

Figure 3E:
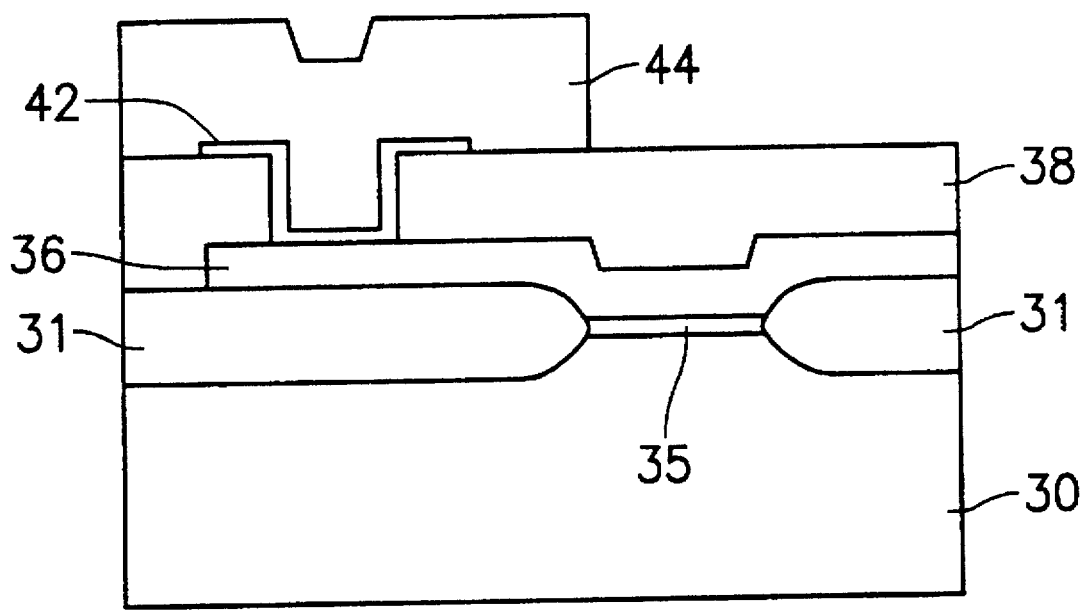

Referring to FIG. 3E, on the dielectric layer 38 and the contact window 40, an insulator 42 is deposited and defined by etching. For example, by using CVD (chemical vapor deposition), a silicon dioxide layer, a silicon nitride layer and a silicon dioxide layer are deposited in sequence to form an ONO (oxide, nitride and oxide) layer 42 on the dielectric layer 38 and the contact window 40, whereupon the shape of the ONO layer 42 is defined by etching, using a mask pattern.

A metal contact layer 44 is then deposited over the etched ONO layer 42 and then defined to complete the fabrication of EPROM memory.

According to the method of the invention, the coupling region is defined by the metal contact layer 44 without forming the buried $N^+$carrier areas, so that lateral diffusion will not occur.

Moreover, by providing a EPROM memory fabricated according to the method of the invention and having the ONO layer 42, electrons will traverse from the polysilicon layer 16 through the ONO layer 42 by raising the voltage of the contact layer 44. Accordingly, the polysilicon layer 16 becomes charged with a positive voltage and the silicon substrate is induced by the gate electrode to form a channel; so that the transistor 20 becomes conductive. Thus, the data can be stored.

As discussed above, since the gate oxide layer and the insulator (the ONO layer) are formed individually, the thickness of the gate oxide layer and the insulator can be reduced to obtain a higher coupling ratio without affecting the quality of the gate oxide layer.

Furthermore, because the invention uses a contact layer with a mask for etching, to fabricate the EPROM memory, $N^+$carrier areas are eliminated. Therefore, this method can be applied to a wider range of applications that can the conventional method.

Although the example discussed herein is applied to N-channel devices, it should be noted that the invention is not so limited. Those skilled in the art will understand that the invention also can be used in other applications. Additionally, the materials and process conditions are only used for illustration and not to limit the scope of the invention.

While the invention has been particularly shown and described with reference to the preferred embodiment thereof, it will be understood by those skilled in the art that various changes in form and details may be made without departing from the spirit and scope of the invention.

What is claimed is:

1. A method of fabricating an EPROM memory, comprising the steps of:
   a. providing a silicon substrate with a field oxide layer to isolate a predetermined active area;
   b. forming a gate oxide layer overlying the substrate;
   c. depositing a polysilicon layer on the field oxide layer and the gate oxide layer and etching a portion of the polysilicon layer to define a gate electrode;
   d. selectively implanting impurities into the substrate by using the gate electrode as a mask, to provide source and drain electrodes;
   e. forming a dielectric layer over the polysilicon layer;
   f. forming a contact window in a predetermined area of said dielectric layer by etching;
   g. depositing and defining by etching an insulator layer on the dielectric layer and the contact window; and
   h. depositing and defining by etching a metal contact layer over the insulator layer and the dielectric layer.

2. The method of claim 1, wherein the silicon substrate provided in said step a is an N-type silicon substrate with a P-well.

3. The method of claim 1, wherein said step b includes forming the gate oxide layer by thermal oxidation.

4. The method of claim 1, wherein said step b includes depositing the gate oxide layer using chemical vapor deposition.

5. The method of claim 1, wherein the gate electrode defined in said step c consists of portions of the polysilicon layer and the gate oxide layer.

6. The method of claim 1, wherein the impurities implanted in said step d are N-type.

7. The method of claim 6, wherein the N-type impurities are arsenic ions.

8. The method of claim 1, wherein the dielectric layer is formed of boric phosphoric silicon glass in said step e.

9. The method of claim 1, wherein the insulator layer deposited in said step g is a three-layer structure of oxide/nitride/oxide.

10. The method of claim 9, wherein the insulator layer is a three-layer structure of silicon dioxide/silicon nitride/silicon dioxide.

* * * * *